(12) United States Patent
Fukuoka et al.

(10) Patent No.: US 7,918,939 B2
(45) Date of Patent: Apr. 5, 2011

(54) SEMICONDUCTOR MANUFACTURING APPARATUS AND SEMICONDUCTOR MANUFACTURING METHOD USING THE SAME

(75) Inventors: Yusuke Fukuoka, Nara (JP); Katsushi Kishimoto, Kyoto (JP)

(73) Assignee: Sharp Kabushiki Kaisha, Osaka (JP)

( * ) Notice: Subject to any disclaimer, the term of this patent is extended or adjusted under 35 U.S.C. 154(b) by 727 days.

(21) Appl. No.: 10/585,858

(22) PCT Filed: Jan. 28, 2005

(86) PCT No.: PCT/JP2005/001253
§ 371 (c)(1),
(2), (4) Date: Jul. 12, 2006

(87) PCT Pub. No.: WO2005/074020
PCT Pub. Date: Aug. 11, 2005

(65) Prior Publication Data
US 2007/0137570 A1    Jun. 21, 2007

(30) Foreign Application Priority Data

Jan. 30, 2004  (JP) ................................ 2004-023546

(51) Int. Cl.
*C23C 16/00* (2006.01)
*B65H 1/00* (2006.01)
(52) U.S. Cl. .................. 118/719; 156/345.31; 414/935
(58) Field of Classification Search ............. 156/345.31, 156/32
See application file for complete search history.

(56) References Cited

U.S. PATENT DOCUMENTS
4,348,139 A * 9/1982 Hassan et al. ............... 406/10
(Continued)

FOREIGN PATENT DOCUMENTS
JP    63-190338    8/1988
(Continued)

OTHER PUBLICATIONS

English Translation of the International Preliminary Report on Patentability mailed Aug. 31, 2006 in the corresponding PCT application No. PCT/JP2005/001253.

(Continued)

*Primary Examiner* — Karla Moore
*Assistant Examiner* — Nathan K Ford
(74) *Attorney, Agent, or Firm* — Nixon & Vanderhye, PC

(57) ABSTRACT

A semiconductor manufacturing apparatus comprising: a plurality of vacuum chambers corresponding to a plurality of processing sections necessary for manufacturing a semiconductor device; an exhaust device connected to each vacuum chamber; a plate shaped guide plate arranged at the bottom of each vacuum chamber and having a plurality of gas emission holes; and a gas supply source for supplying gas to the gas emission holes, wherein the plurality of vacuum chambers are adjacent to each other by way of a shutter, one of the two adjacent vacuum chambers includes a tray mounted on the guide plate for mounting a substrate to be performed with a predetermined process, a conveying function section having a conveying arm for moving the tray from one vacuum chamber to the other vacuum chamber along the guide plate, and a controlling function section, the controlling function section performing the control so as to open the shutter to communicate the two adjacent vacuum chambers, emit gas from the gas emission holes of the guide plate of the vacuum chambers, and move the tray in one vacuum chamber, which is floated by the emitted gas, from the guide plate of one vacuum chamber to the guide plate of the other vacuum chamber along the guide plate by means of the conveying arm.

15 Claims, 11 Drawing Sheets

U.S. PATENT DOCUMENTS

| | | | | |
|---|---|---|---|---|
| 5,174,881 A | * | 12/1992 | Iwasaki et al. | 204/298.25 |
| 2002/0139481 A1 | * | 10/2002 | Baxter et al. | 156/345.51 |
| 2004/0211516 A1 | * | 10/2004 | Rigali et al. | 156/345.31 |

FOREIGN PATENT DOCUMENTS

| | | |
|---|---|---|
| JP | 63-202516 | 8/1988 |
| JP | 02-130849 | 5/1990 |
| JP | 02-207546 | 8/1990 |
| JP | 04-139854 | 5/1992 |
| JP | 5-37771 | 5/1993 |
| JP | 06-275698 | 9/1994 |
| JP | 08-139072 | 5/1996 |
| JP | 11-222675 | 8/1999 |
| JP | 2000-072251 | 3/2000 |
| JP | 2001-176950 | 6/2001 |

OTHER PUBLICATIONS

International Search Report for PCT/JP2005/001253 dated May 17, 2005.

* cited by examiner

SEMICONDUCTOR MANUFACTURING APPARATUS AND SEMICONDUCTOR MANUFACTURING METHOD USING THE SAME

CROSS-REFERENCES TO RELATED APPLICATIONS

This application is the US national phase of international application PCT/JP2005/001253 filed 28 Jan. 2005, which designated the U.S. and claims priority to JP 2004-023546 filed 30 Jan. 2004, the entire content of each of which is hereby incorporated by reference.

TECHNICAL FIELD

The present technology relates to a semiconductor manufacturing apparatus and a semiconductor manufacturing method using the same, and more particularly to a semiconductor manufacturing apparatus including a plurality of vacuum chambers adjacent to each other, which correspond to a plurality of processing sections necessary for manufacturing a semiconductor device, and a semiconductor manufacturing method using the same.

BACKGROUND ART

A semiconductor manufacturing apparatus that employs a vacuum chamber is generally used when manufacturing a semiconductor thin film on a substrate.

Such a semiconductor manufacturing apparatus generally includes a plurality of vacuum chambers with a processing function necessary for manufacturing the semiconductor device such as film growing, and a conveying mechanism for conveying the substrate to be performed with the semiconductor manufacturing process between a plurality of vacuum chambers.

An in-line type using a tray and a feeding type using a vacuum robot and a transfer chamber are known as the conveying mechanism.

In the in-line type, a method of holding the tray using a wheel or a bearing and applying driving force using a chain or a gear etc. and to convey the tray is known (see e.g., Japanese Laid-Open Patent Publication No. H02-207546).

In the feeding type, a method in which a transformer chamber for arranging the robot is provided, vacuum chambers are arranged with the transfer chamber at the center, and the substrate is conveyed with a fork and the like attached to the robot is known (see e.g., Japanese Laid-Open Patent Publication No. H11-222675).

The structure of the apparatus is complicating in the in-line type, since the method that is adopted uses wheel, bearing or the like to hold the tray.

For instance, when using a plurality of vacuum chambers, different vacuum chambers are used for the respective purpose such as a charging room, reaction room etc., and a movable portion is arranged even in the reaction room where high cleanliness is required, and the cleanliness is reduced.

Since the tray is held with the wheel, bearing or the like, the contacting portion with respect to the device main body is limited, and grounding of the tray becomes a problem when using a high frequency power supply and the like.

If heating is involved in the manufacturing step of the semiconductor device, a certain degree of clearance must be provided in consideration of thermal expansion caused by heating in order for the drive portion such as chain, toothed gear or the like to continue to appropriately function around the time of heating, but such clearance may possibly lower the conveyance precision.

Countermeasures have been proposed such as configuring the drive portion with a material of small thermal expansion or suppressing thermal expansion by cooling the drive portion, but the cost increases or the structure of the apparatus becomes complicating in either case.

Further, with regards to the positioning of the tray, a detector for accurately detecting the position of the tray, and an actuator or a driving device of high precision for stopping the tray at a predetermined position at satisfactory precision are required, which increases cost and complicates the structure of the apparatus.

In the case of the feeding type conveying method using the vacuum robot, the transformer chamber for installing the vacuum robot must be arranged, which leads to increase in the device installation area. Further, an image recognizing device or other positioning mechanisms must be used to perform positioning of the substrate to be conveyed, which increases the cost and complicates the structure of the apparatus.

SUMMARY OF THE TECHNOLOGY

Problems that the Technology is to Solve

The present technology is devised in view of the above problems, and an object thereof is to provide a semiconductor manufacturing apparatus for conveying the substrate at satisfactory precision with a simple configuration, and a semiconductor manufacturing method using the same.

Means of Solving the Problems

The present technology provides a semiconductor manufacturing apparatus comprising: a plurality of vacuum chambers corresponding to a plurality of processing sections necessary for manufacturing a semiconductor device; an exhaust device connected to each vacuum chamber; a plate shaped guide plate arranged at the bottom of each vacuum chamber and having a plurality of gas emission holes; and a gas supply source for supplying gas to the gas emission holes, wherein the plurality of vacuum chambers are adjacent to each other by way of a shutter, one of the two adjacent vacuum chambers includes a tray mounted on the guide plate for mounting a substrate to be performed with a predetermined process, a conveying function section having a conveying arm for moving the tray from one vacuum chamber to the other vacuum chamber along the guide plate, and a controlling function section, the controlling function section performing the control so as to open the shutter to communicate the two adjacent vacuum chambers, emit gas from the gas emission holes of the guide plate of the vacuum chambers, and move the tray in one vacuum chamber, which is floated by the emitted gas, from the guide plate of one vacuum chamber to the guide plate of the other vacuum chamber along the guide plate by means of the conveying arm.

A semiconductor manufacturing method using the semiconductor manufacturing apparatus comprising the steps of: mounting the substrate for semiconductor device on the tray of one of the two adjacent vacuum chambers; exhausting one of the vacuum chambers with the exhaust device and performing processes necessary for manufacturing the semiconductor device; communicating the two vacuum chambers by opening the shutter; floating the tray mounted with the substrate by emitting gas from the gas emission holes of the guide plate of the one or the other vacuum chamber; moving the tray in the floating state along the guide plate from the guide plate of one vacuum chamber to the guide plate of the other vacuum chamber by means of the conveying arm; stopping the emission of the gas; isolating the other vacuum chamber by closing the shutter, exhausting the other vacuum chamber with the exhaust device; and performing the processes necessary for manufacturing the semiconductor on the substrate on the tray.

Effects of the Technology

Since the gas is emitted from the gas emission holes of the guide plate of one or the other vacuum chambers and the conveying arm is capable of moving the tray in one vacuum chamber, which is in the floated state by the emitted gas, from the guide plate of one vacuum chamber to the guide plate of the other vacuum chamber along the guide plate when the conveying arm moves the tray, the movable portion or the drive portion necessary for conveying the substrate is reduced as much as possible, and the substrate is conveyed at satisfactory precision with a simple configuration. Further, by arranging the conveying arm in one of the two adjacent vacuum chambers, a transfer chamber for temporarily accommodating the conveying robot or the substrate before input and the like becomes unnecessary.

That is, the conveying mechanism is simple, and the conveyance drive section is not necessary in the vacuum chamber, whereby various problems of the substrate processing device pertaining to the in-line conveying method and the feed conveying method of the prior art are resolved, that is, complication of the structure of the apparatus and increase in cost resulting therefrom, lowering of cleanliness in the vacuum chamber caused by the conveyance drive section, grounding of the tray, lowering of conveyance precision, and increase in device installation area.

BEST MODE FOR CARRYING OUT THE TECHNOLOGY

Figure 1:
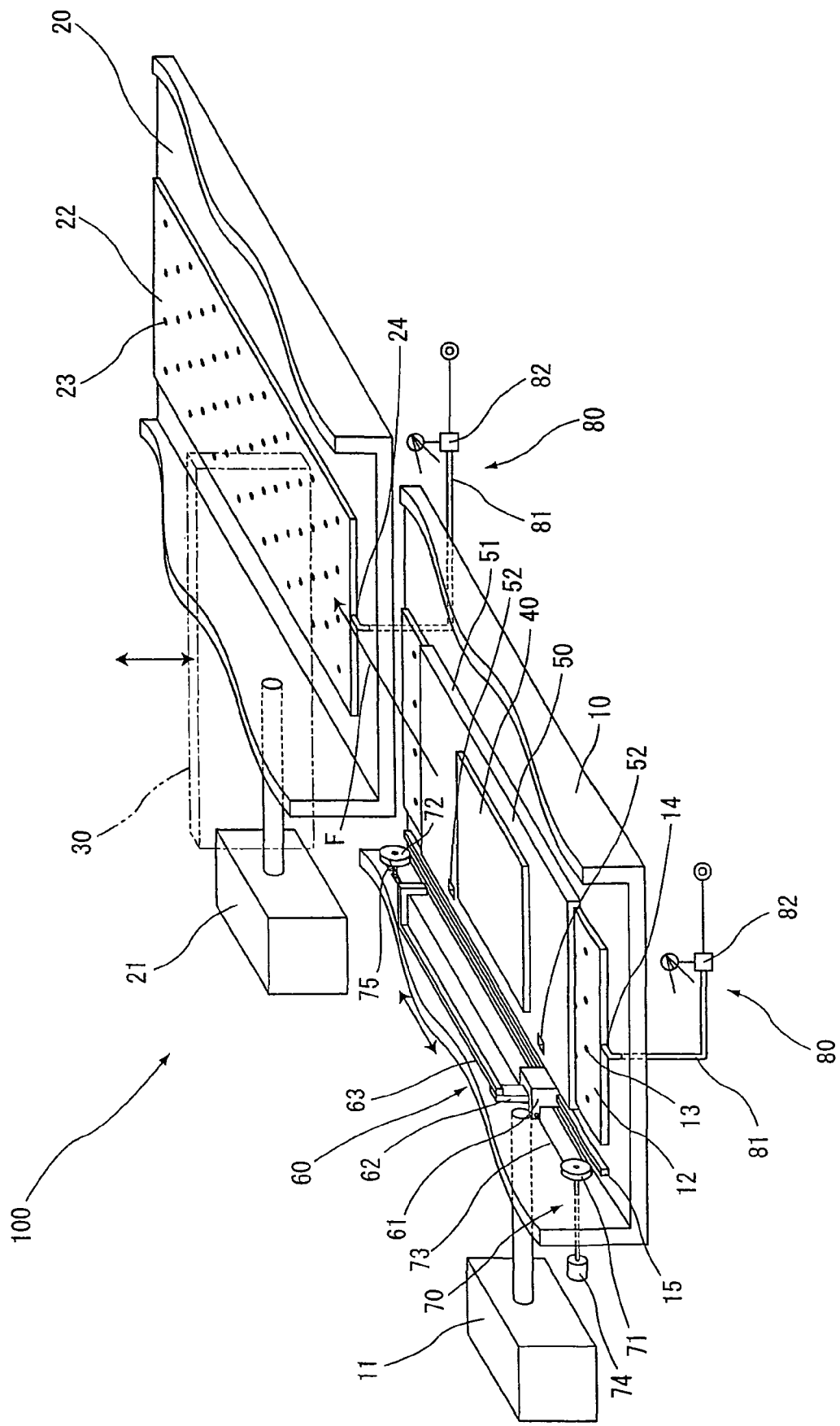
FIG. 1 is a perspective view of a semiconductor manufacturing apparatus according to embodiment 1.

The semiconductor manufacturing apparatus comprises a plurality of vacuum chambers corresponding to a plurality of processing sections necessary for manufacturing a semiconductor device; an exhaust device connected to each vacuum chamber; a plate shaped guide plate arranged at the bottom of each vacuum chamber and having a plurality of gas emission holes; and a gas supply source for supplying gas to the gas emission holes, wherein the plurality of vacuum chambers are adjacent to each other by way of a shutter, one of the two adjacent vacuum chambers includes a tray mounted on the guide plate for mounting a substrate to be performed with a predetermined process, a conveying function section having a conveying arm for moving the tray from one vacuum chamber to the other vacuum chamber along the guide plate, and a controlling function section, the controlling function section performing the control so as to open the shutter to communicate the two adjacent vacuum chambers, emit gas from the gas emission holes of the guide plate of the vacuum chambers, and move the tray in one vacuum chamber, which is floated by the emitted gas, from the guide plate of one vacuum chamber to the guide plate of the other vacuum chamber along the guide plate by means of the conveying arm.

In the semiconductor manufacturing apparatus, the vacuum chamber for semiconductor manufacturing includes all the vacuum chambers used in manufacturing the semiconductor device, and the application thereof is not particularly limited. The processes necessary for manufacturing the semiconductor device refers to various processes performed on various substrates such as semiconductor substrate, glass substrate and the like when manufacturing the semiconductor device such as film growing, plasma processing, annealing process and the like. Thus, the plurality of vacuum chambers lined adjacent to each other may be configured so as to include the processing sections with predetermined processing functions for manufacturing the semiconductor device in the order of the processing steps. The semiconductor device that can be manufactured with the present technology is a semiconductor device performed with the above processes, and may be a semiconductor device such as a transistor, memory, IC, LSI and the like, organic or inorganic solar battery, display such as liquid crystal, plasma, electroluminescence and the like.

The vacuum chamber only needs to be a sealable configuration that can withstand the gas pressure and the temperature when performing the processes necessary for manufacturing the semiconductor device, and thus the shape, material and the like thereof are not particularly limited. For instance, a chamber made of stainless steel with a sealable lid may be used as the vacuum chamber. A plurality of vacuum chambers are configured by partitioning one casing extending straight in the longitudinal direction into a plurality of partitions by means of the shutter.

The exhaust device connected to each vacuum chamber may be of any type that can exhaust each vacuum chamber to a predetermined degree of vacuum, and is not particularly limited, and thus a general vacuum pump and the like may be used. One exhaust device may be connected to each of the plurality of vacuum chambers, or one exhaust device may be connected to a plurality of vacuum chambers.

In the semiconductor manufacturing apparatus, the controlling function section has a configuration of including an operation controlling section for performing operation control of the conveying arm and the shutter, and a pressure controlling function section for performing pressure control of each vacuum chamber. The operation controlling section and the pressure controlling function section may operate cooperatively.

In this case, the pressure controlling function section may have a configuration of including a pressure adjusting gas supply source for supplying pressure adjusting gas to each vacuum chamber, a pressure detecting part for detecting the pressure in each vacuum chamber, an adjustment valve for adjusting the exhausting amount from each vacuum chamber, and a pressure controlling section for controlling the adjustment valve so as to adjust the pressure of each vacuum chamber when input with a signal from the pressure detecting part. Specifically, a capacitance manometer and the like that can measure the pressure quantitatively and continuously may be used for the pressure detecting part, a throttle valve and the like may be used between the vacuum chamber and the exhaust section in an exhaust tube for the adjustment valve, and a sequence controller for controlling or time series controlling the flow rate adjustment valve to maintain the pressure in the chamber to an appropriate value by being set and input with an appropriate pressure value of the processing chamber and comparing the pressure value data from the pressure detector and the appropriate pressure value data.

Further, the pressure controlling function section may include a separate pressure controlling section for controlling the pressure of the gas emitted from the gas emission holes by the gas supply source. In such configuration, the pressure controlling section on the gas supply source side may control the pressure of the gas within a range of 160 to 800 times of the reference value, which reference value is the value obtained by dividing the total weight of the tray and the substrate by the area of the tray.

If one exhaust device is connected to each of the plurality of vacuum chambers, the adjustment valve is arranged in the exhaust tube between each vacuum chamber and each exhaust device. In addition, if one exhaust device is connected to the plurality of vacuum chambers, the adjustment valve is arranged in each branched tube branching from the exhaust device to each vacuum chamber.

The flow rate adjustment valve such as a throttle valve that allows the necessary amount of gas to be introduced when necessary in cooperation with the pressure detecting part may be arranged in the pressure adjustment gas supply source. One pressure adjustment gas supply source may be provided for a plurality of vacuum chambers. In this case, it is preferable that the branched tube branching from the pressure adjustment gas supply source to each vacuum chamber is arranged, and further that the flow rate adjustment valve is arranged in each branched tube to individually control the supply of pressure adjustment gas to each vacuum chamber.

The gas of the gas supply source and the pressure adjustment gas only need to be that which does not damage the vacuum chamber, the guide plate, the tray, the substrate and the like, and are not particularly limited. Any of nitrogen gas, argon gas, helium gas, and hydrogen gas, or a mixed gas of two or more of these may be used.

The guide plate is such that floats the plate by emitting gas from the gas emission holes and that acts as a guide when moving the plate, and is not particularly limited in terms of shape, material and the like as long as it can withstand the gas pressure, the temperature and the like of the various processes performed in each vacuum chamber. For instance, a hollow plate shaped body including a gas introduction port and a gas emission holes may be used as the guide plate, which material may be stainless steel and the like. In a plurality of vacuum chambers adjacent to each other by way of the shutter, the guide plate arranged in each vacuum chamber is arranged straight in the tray conveying direction.

With respect to the diameter and the interval of the gas emission holes of the guide plate, in view of realizing float and smooth movement of the tray, it is preferable to make the diameter of the gas emission holes of the guide plate as small as possible, and preferably, to form such gas emission holes having the diameter of about 0.5 to 4 mm at an interval of 10 to 100 mm.

The tray may be such that moves between a plurality of vacuum chambers with the substrate mounted thereon and is not particularly limited in terms of shape, material and the like as long as it can withstand the gas pressure, the temperature and the like of various processes performed in each vacuum chamber, but is preferably as light as possible since it is to be floated. A plate shaped tray made of stainless steel may be used for the tray.

In the semiconductor manufacturing apparatus, the tray may include a locking part for locking the guide plate when being moved by the conveying arm. The locking part may be of any type as long as it locks with the guide plate without interfering with the conveyance of the tray, and thus the configuration thereof is not particularly limited. For instance, when the guide plate is a square with a longitudinal direction, and the guide plates of one or the other vacuum chamber are arranged so as to line along the longitudinal direction with respect to each other in a plurality of adjacent vacuum chambers, the two opposing edges of the tray may have a shape bent at right angles so as to lie along the two sides extending in the longitudinal direction of the guide plate. The locking part is an independent component that can lock with the two sides of the guide plate, and may be configured so as to be attached to the tray. The dimension of the distance between the locking part and the guide plate facing each other is preferably about 0.1 to 3 mm in total.

The tray can be stably moved at satisfactory precision by arranging the locking part on the tray, since the tray is guided in the conveying direction without detaching from the guide plate by the locking part during the movement of the tray.

In the semiconductor manufacturing apparatus, the conveying function section arranged in one vacuum chamber further includes a drive section for moving the conveying arm in the two adjacent vacuum chambers, which drive section may be configured by a pair of pulleys and a wire winded around the pair of pulleys. In this case, one of the pulleys is preferably configured so as to be rotatably driven by a rotation drive source such as a motor arranged exterior to the vacuum chamber.

According to such configuration, the conveying arm can be smoothly moved irrespective of the change in the pitch such as the chain or toothed gear as in the prior art. Further, the cleanliness of the vacuum chamber is not affected since the movable portion is made as few as possible compared to the conveying mechanism configured by chain, toothed gear and the like.

In the conveying function section of the above configuration, the drive section may include a tensile force adjustment mechanism for maintaining the tensile force of the wire constant. The tensile force adjustment mechanism may adopt a configuration of pulling the driven pulley in a direction of removing sagging of the wire with a spring, a configuration of arranging a pulling spring at the end in the middle of the wire between the pair of pulleys, or a configuration of pressing a part of the wire between the pair of pulleys with a freely rotatable pressing pulley.

According to such configuration, the tensile force of the wire is maintained constant even under a heating condition in which thermal expansion of the wire is a concern, and thus free spinning of the pulley and the wire is prevented, and the conveying arm can be moved at satisfactory precision.

In the conveying function section of the above configuration, the conveying arm is fastened at one point on the wire, where the moving distance of the conveying arm and the moving distance of the one point on the wire are the same when the wire is winded by the pair of pulleys.

According to such configuration, the moving distance of the tray moved by the conveying arm is defined by the moving distance of the wire that moves the conveying arm, and thus the tray is moved at satisfactory precision with a simple configuration.

In the semiconductor manufacturing apparatus, a method of engageably engaging the distal end of the conveying arm to the engagement part arranged at the tray and pushing, or a method of pushing the back end of the tray with the distal end of the conveying arm may be adopted to move the floated tray with the conveying arm.

In the former case, the engagement part is arranged in pluralities so as to be lined at a predetermined interval along the moving direction of the tray, and the conveying arm is connected to the wire of the drive section by way of a rising and lowering drive section. After the conveying arm is lowered by the lowering operation of the rising and lowering drive section to engage the engagement part positioned at the front in the moving direction of the tray thereby moving the tray partway to the target position, the conveying arm is risen by the rising operation of the rising and lowering drive section to release the engagement with the engagement part positioned at the front and engage with a different engagement part at the back, thereby moving the tray to the target position. According to such configuration, the tray may be conveyed in a step wise manner, and thus the tray can be moved to the target position, that is, to the adjacent vacuum chamber even if the movable distance of the conveying arm is short.

In the latter case, the tray can be moved to the adjacent vacuum chamber with one operation of the conveying arm in the conveying direction. In this case, the conveying arm is configured to a shape in which the attaching position of the conveying arm to the wire is towards the back in the conveying direction from the tray contacting position to allow the tray contacting site of the conveying arm to enter the adjacent vacuum chamber.

In the above configuration including the engagement part on the tray, the emission of gas from the gas emission holes is interrupted from the time the conveying arm releases the engagement with the engagement part positioned at the front until the conveying arm engages a different engagement part, and the tray may be grounded to the guide plate and positioned at the relevant position while the emission of the gas is being interrupted.

The tray may be grounded to the guide plate and positioned at the relevant position as the emission of gas from the gas emission holes stops.

In this case, the positioning refers to a state in which the tray does not move from the grounded position in the conveying direction due to friction resistance between the lower surface of the tray and the upper surface of the guide plate contacting each other, and in which the tray does not move in a direction orthogonal to the conveying direction due to the friction resistance or the locking part.

According to such configuration, the positioning mechanism for defining the position of the tray in the vacuum chamber is omitted, and thus the configuration of the semiconductor manufacturing apparatus is simplified.

Further, if the vacuum chamber, the guide plate, and the tray are made of metal, and an electrical grounding of the guide plate with respect to the vacuum chamber is satisfactory, a satisfactory electrical grounding is also obtained for the tray grounded to the guide plate.

Seeing the present technology from a different point of view, the semiconductor manufacturing method using the semiconductor manufacturing apparatus described above comprising the steps of: mounting the substrate for semiconductor device on the tray of one of the two adjacent vacuum chambers; exhausting one of the vacuum chambers with the exhaust device and performing processes necessary for manufacturing the semiconductor device; communicating the two vacuum chambers by opening the shutter; floating the tray mounted with the substrate by emitting gas from the gas emission holes of the guide plate of the one and the other vacuum chamber; moving the tray in the floating state along the guide plate from the guide plate of one vacuum chamber to the guide plate of the other vacuum chamber by means of the conveying arm; stopping the emission of the gas; isolating the other vacuum chamber by closing the shutter, exhausting the other vacuum chamber with the exhaust device; and performing the processes necessary for manufacturing the semiconductor on the substrate on the tray.

The semiconductor manufacturing method also may be such that the two adjacent vacuum chambers are communicated by opening the shutter, and the pressure of each vacuum chamber is detected and adjusted to a predetermined pressure for reducing the vibration of the tray to be floated, and thereafter, the gas is emitted from the gas emission holes of each guide plate of each vacuum chamber to float the tray on one guide plate, and the floated tray is moved from one vacuum chamber to the other vacuum chamber by means of the conveying arm while maintaining the pressure of each vacuum chamber at the predetermined pressure.

That is, the tray is prevented from vibrating by the gas emitted from the gas emission holes of the guide plate by appropriately adjusting the chamber pressure of both vacuum chambers that are communicating with each other when conveying the tray in the floating state. In other words, if the chamber pressure is low, the tray mounted with the substrate vibrates by an inactive gas emitted from the gas emission holes, and a stable conveyance may not be performed. However, by continuously carrying out the pressure control of each chamber before conveyance and during conveyance, the buoyancy of the tray is held constant and the tray is continuously held at the stable orientation during the conveying period, and further, the damage or shift movement of the substrate on the tray by the vibration of the tray is prevented.

In the semiconductor manufacturing method, the pressure adjustment gas is introduced into each vacuum chamber, and the pressure of each vacuum chamber is adjusted to $1/100000$ to 1 times, preferably, $1/800$ to $1/5$ times of the gas introducing pressure of the gas supply source for supplying the gas to the gas emission holes when adjusting the pressure of each vacuum chamber to the predetermined pressure that reduces the vibration of the tray to be floated. If the predetermined pressure that reduces the vibration of the tray to be floated is smaller than 1/800 times the gas introducing pressure of the gas supply source for supplying gas to the gas emission holes, tray may vibrate since the emission of the gas from the gas emission holes is too strong, whereas if the predetermined pressure is greater than 1/5 times, the buoyancy of the tray lowers and the tray may contact the guide plate.

The step of exhausting each vacuum chamber more than once with the exhaust device may be performed before adjusting the pressure of the two adjacent vacuum chambers to a predetermined pressure at which the tray to be floated does not vibrate, or the step of introducing the pressure adjustment gas into each vacuum chamber may be performed between the exhausting steps when performing the exhausting step two or more times. The impurity concentration in the chamber is lowered so as to enhance cleanliness with such steps, and is preferable since the cleanliness enhances the more the exhausting and gas introducing operations are repeated. Since the impurities such as microscopic dust and the like in the air enters the vacuum chamber when the vacuum chamber is opened to atmosphere, the predetermined semiconductor manufacturing processes can be performed in the vacuum chamber at high precision by performing such cleaning (flushing).

Further, the exhausting of at least one vacuum chamber out of two vacuum chambers may be stopped while adjusting the two adjacent vacuum chambers in communication with each other to the predetermined pressure that does not vibrate the tray to be floated.

When each vacuum chamber is pressure controlled, the pressure control for each vacuum chamber interferes with each other thereby making the pressure adjustment difficult. However, if the pressure control of one vacuum chamber is performed with the pressure control of the other vacuum chamber, it can be easily performed without interference of the pressure control as described above.

The present technology will now be described in detail based on the embodiments shown in the figure.

Embodiment 1

The semiconductor manufacturing apparatus according to embodiment 1 will now be explained based on FIGS. 1 to 11, and FIG. 15.

Figure 2:
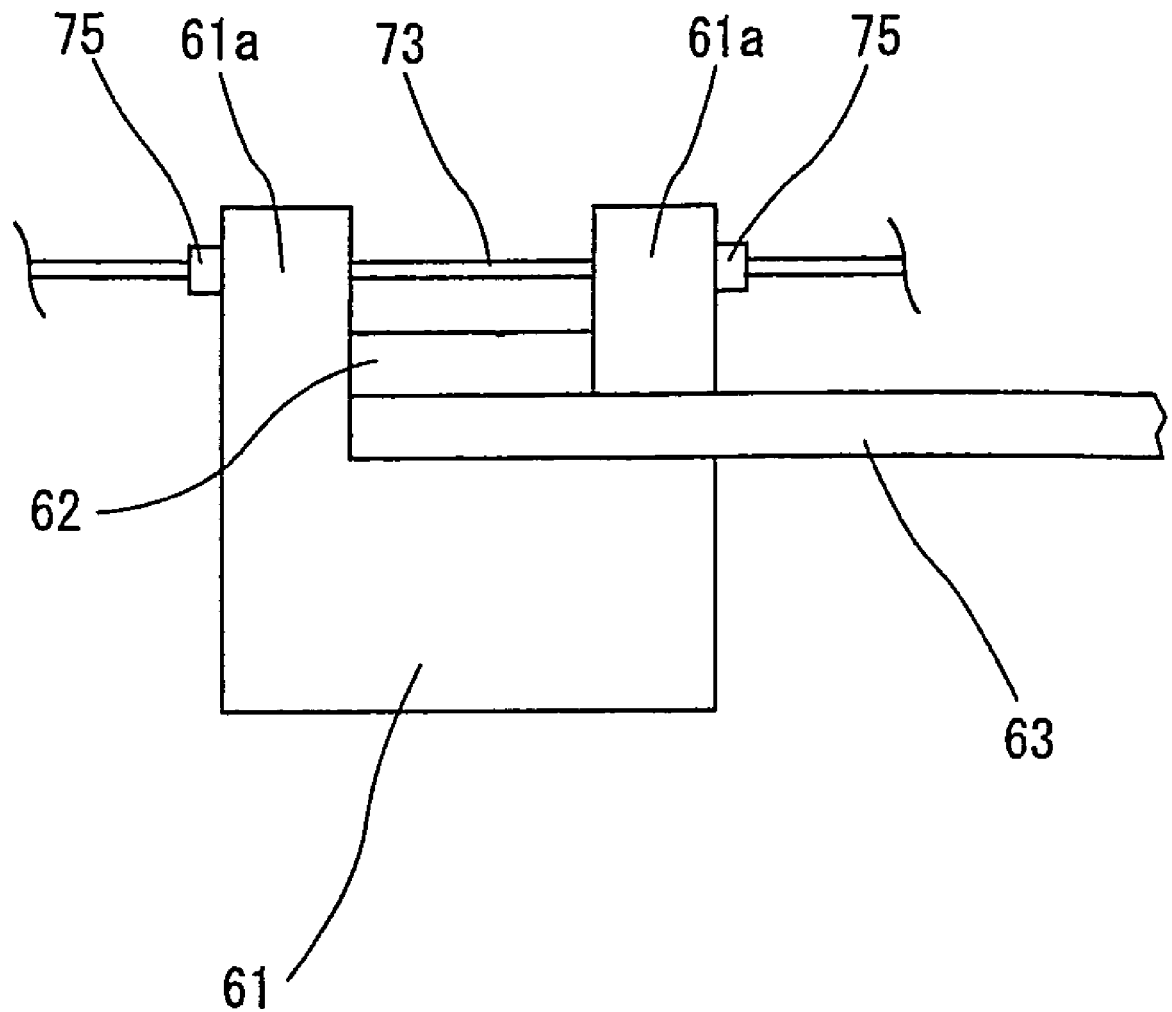
FIG. 2 is a partially enlarged plan view of the semiconductor manufacturing apparatus shown in FIG. 1.
Figure 15:
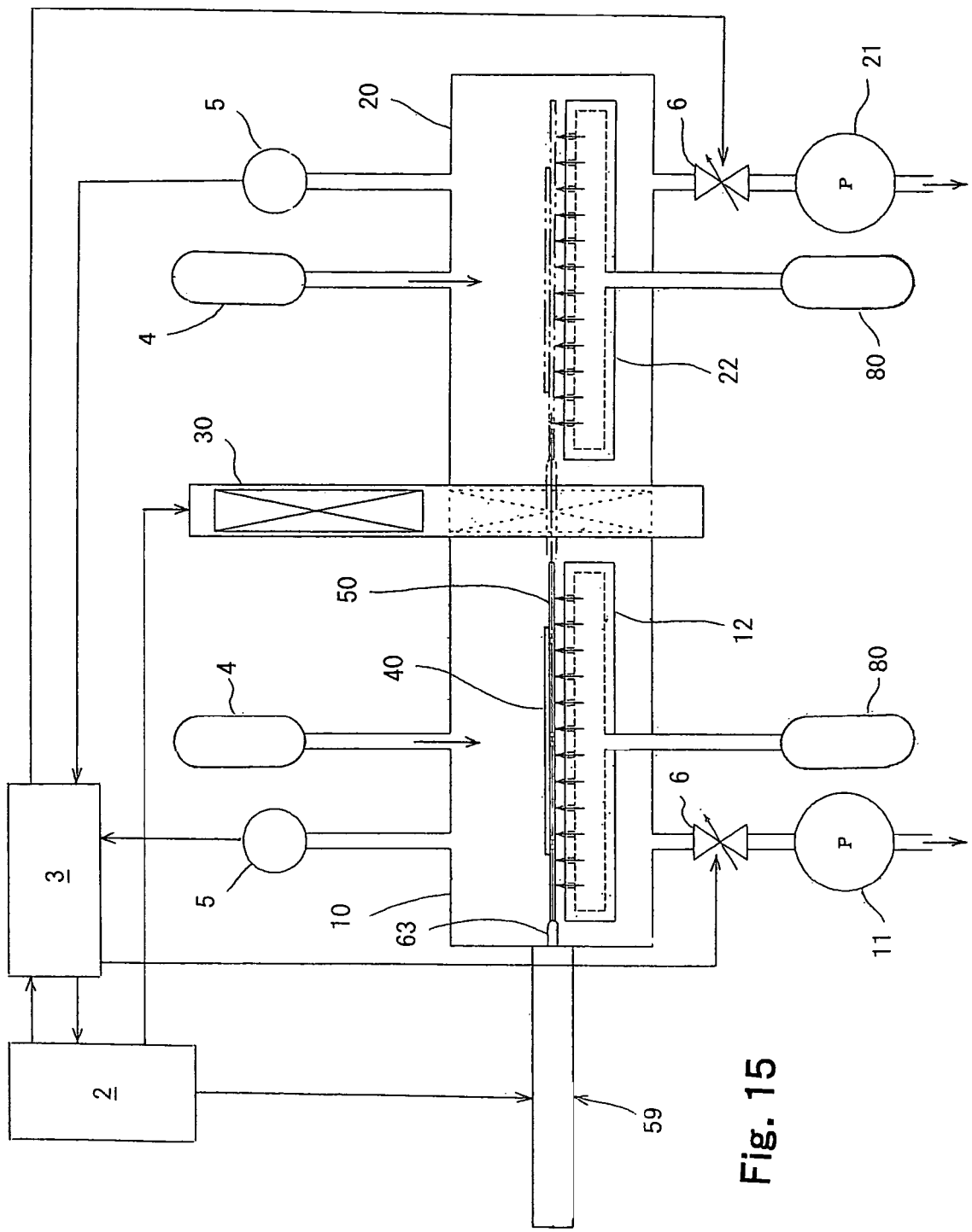
FIG. 15 is a schematic configuration view of the semiconductor manufacturing apparatus shown in FIG. 1.

FIG. 1 is a perspective view of a semiconductor manufacturing apparatus according to embodiment 1, FIG. 2 is a partially enlarged view of the semiconductor manufacturing apparatus shown in FIG. 1, and FIG. 3 to FIG. 11 are explanatory views for explaining the method for moving the plate of the semiconductor manufacturing apparatus shown in FIG. 1. FIG. 15 is a schematic configuration view of the semiconductor manufacturing apparatus shown in FIG. 1. In FIG. 1 and FIG. 15 showing the configuration of the semiconductor manufacturing apparatus, the processing section that performs the processes necessary for manufacturing the semiconductor device is omitted.

As shown in FIG. 1, the semiconductor manufacturing apparatus 100 according to embodiment 1 includes first and second vacuum chambers 10, 20 for semiconductor manufacturing, exhaust devices 11, 21 connected to the first and second vacuum chambers 10, 20, respectively, and hollow plate shaped guide plates 12, 22 with a plurality of gas emission holes 13, 23 arranged at the bottom of the first and second vacuum chambers 10, 20, respectively.

The first and second vacuum chambers 10, 20 are adjacent to each other by way of the shutter 30, where the first vacuum chamber 10 includes a tray 50 mounted on the guide plate 12, the tray being mounted with a substrate 40 to be performed with the semiconductor manufacturing process, and a conveying function section 59 having a conveying arm 60 for moving the tray 50 from the first vacuum chamber 10 to the second vacuum chamber 20 along the guide plates 12, 22.

The semiconductor manufacturing apparatus 100 is configured so that when the shutter 30 isolating the first and second vacuum chambers 10, 20 opens to communicate the first and second vacuum chambers 10, 20 adjacent to each other and the conveying arm 60 moves the tray 50, the gas is emitted from the gas emission holes 13, 23 of the guide plates 12, 22 of the first and second vacuum chambers 10, 20, and the conveying arm 60 moves the tray 50, which is in a floating state by the emitted gas, in the first vacuum chamber 10 from the guide plate 12 of the first vacuum chamber 10 to the guide plate 22 of the second vacuum chamber 20 along the guide plates 12, 22.

The first and second vacuum chambers 10, 20 are made of stainless steel, and the interior surface is performed with mirror finishing.

The guide plates 12, 22 are also made of stainless steel, and have a hollow configuration so that the gas introduced from the gas introduction ports 14, 24 is emitted from the gas emission holes 13, 23, and has a rectangular shape in plan view. The guide plates 12, 22 have a mirror finished surface, and have a width of 600 mm, a length of 1000 mm, and a thickness of 30 mm. The diameter of the gas emission holes 13, 23 is 0.5 mm and 5684 holes are formed at an interval of 10 mm.

The guide plate 12 of the first vacuum chamber 10 and the guide plate 22 of the second vacuum chamber 20 are arranged so as to be lined with respect to each other along their longitudinal direction.

The distance from the end of the guide plate 12 of the first vacuum chamber 10 to the end of the guide plate 22 of the second vacuum chamber 20 is 1300 mm and the tray 50 is movable within the range of such distance.

The tray 50 is made of stainless steel and has a rectangular shape in plan view. The face facing the guide plate 12 is performed with mirror finishing realizing a smooth movement, and has a width of 605 mm, a length of 900 mm, and a thickness of 2 mm.

The tray 50 has a locking part 51 for locking the two sides parallel to the longitudinal direction of the guide plates 12, 22 when moved by the conveying arm 60. The locking part 51 has a shape in which both edges parallel to the longitudinal direction of the tray 50 are bent at substantially right angle.

The tray 50 has a fit-in hole (engaging part) 52 for engaging the conveying arm 60, the fit-in hole 52 being formed in the vicinity of the front end of the tray 50 in the conveying direction F of the tray 50 and in the vicinity of the back end of the tray 50.

The conveying arm 60 is mainly configured by a base portion 61 that is fixed to a wire of a drive section 70 to be hereinafter described, and that moves along a rail 15 arranged at the bottom surface of the first vacuum chamber 10; an arm guide 62 arranged so as to rise and lower in the up and down direction along the base portion 61; an arm portion 63 having the basal end attached to the arm guide 62 and the distal end bent downward and moving up and down by the up and down operation of the arm guide 62 to be inserted into or released from the fit-in hole 52 of the tray 50; and a rising and lowering drive section (not shown) that rises and lowers the arm guide 62 with respect to the base portion 61. The rising and lowering drive section preferably has a simple configuration that can withstand the temperature in the vacuum chamber, for instance, a piston mechanism that rises by the gas pressure injected into the cylinder and that lowers by the spring after discharging gas. In this case, heat resistance flexible tube is used for gas injection.

The conveying function section 59 such as the conveying arm 60 and the base portion 61 are mainly made of stainless steel. As shown in FIG. 2, the base portion 61 has inserting portions 61a for inserting the wire 73 and fixing the base portion 61 and the wire 73, the base portion 61 and the wire 73 being fixed with a caulking member 75 attached to the wire 73 that is positioned on both sides of the inserting portions 61a with the wire 73 inserted in the inserting portions 61a.

A hairline finishing is performed on the surface of the arm portion 63 to ensure the friction force with the fit-in hole 52 when fitted into the fit-in hole 52 of the tray 50.

The drive section 70 is mainly configured by a driving pulley 71, a driven pulley 72, the wire 73 fixed to the base portion 61 of the conveying arm 60 and winded to the driving pulley 71 and the driven pulley 72, and a motor 74 for driving the driving pulley 71, and the conveying arm 60 can be moved by the same distance as the moving distance of the wire 73.

The drive section 70 further includes a spring 75 serving as a tensile force adjustment mechanism for maintaining the tensile force of the wire 73 constant. In the embodiment, the tensile force of the wire 73 is maintained constant by pulling the driven pulley 72 with the spring 75 in the direction of removing sagging of the wire 73.

The driving pulley 71 and the driven pulley 72 are both made of stainless steel and have a diameter of 100 mm.

The moving distance in the front and back direction of the conveying arm 60 is defined by the shorter one of either the effective length of the rail 15 or the distance between the driving pulley 71 and the driven pulley 72. Since the distance between the driving pulley 71 and the driven pulley 72 is shorter than the rail 15 in the embodiment, the moving distance in the front and back direction of the conveying arm 60 becomes 650 mm.

As shown in FIG. 15, the semiconductor manufacturing apparatus also includes a controlling function section having an operation controlling section 2 for performing the operation control of the conveying arm and the shutter, and a pressure controlling function section for performing the pressure control of the first and second vacuum chambers 10, 20.

The pressure controlling function section 3 includes an inactive gas supply source 80, 80 for supplying the inactive gas to the guide plates 12, 22 of the first and second vacuum chambers 10, 20, a pressure adjustment gas supply source 4, 4 for supplying the pressure adjustment gas to the first and second vacuum chambers 10, 20, a pressure detecting part 5, 5 for detecting the pressure of each vacuum chamber 10, 20, an adjustment valve 6, 6 for adjusting the exhausting amount from each vacuum chamber 10, 20, and a pressure controlling part 3 input with a signal from the pressure detecting part 5, 5 thereby controlling the adjustment valve 6, 6 so as to adjust the pressure of each vacuum chamber 10, 20.

The gas supply source 80 is mainly configured by a gas supply tube 81 connected to the gas introducing ports 14, 24 of the guide plates 12, 22, and a pressure controlling part 82 for controlling the pressure of the gas supplied to the gas supply tube 81.

The pressure of gas introduction controlled by the pressure controlling part 82 is determined by the sum of the weight of the tray 50 and the weight of the substrate 40 to be mounted on the tray 50. This will be hereinafter described in detail.

The conveying operation of the tray of the semiconductor manufacturing apparatus of the above configuration will be mainly explained based on FIGS. 3 to 11, and FIG. 15. FIGS. 3 to 11 are explanatory views explaining the method of moving the tray of the semiconductor device shown in FIG. 1, where (a) is a plan view and (b) is a side view in each figure. The walls of the first and second vacuum chambers, the shutter, the gas supply source, the exhaust device, and the substrate to be mounted on the tray are omitted in the figure. The presence of the first vacuum chamber and the second vacuum chamber is schematically shown with a chain double-dashed line.

Figure 3A:
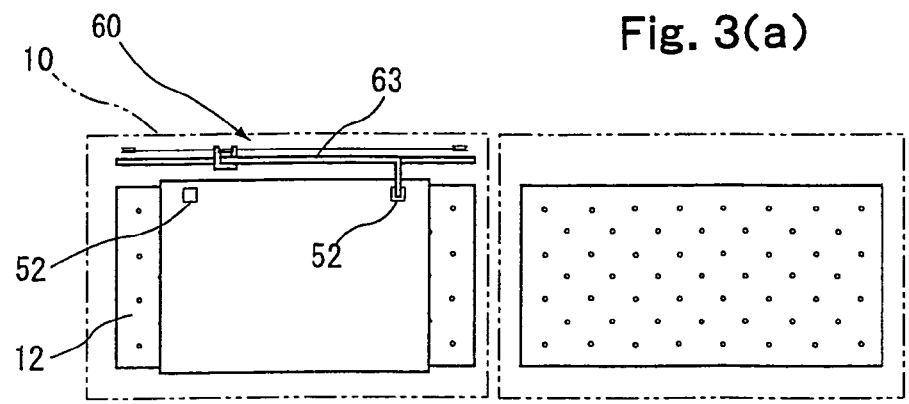
FIG. 3 is an explanatory view explaining a method of moving a plate of the semiconductor manufacturing apparatus shown in FIG. 1.
Figure 3B:
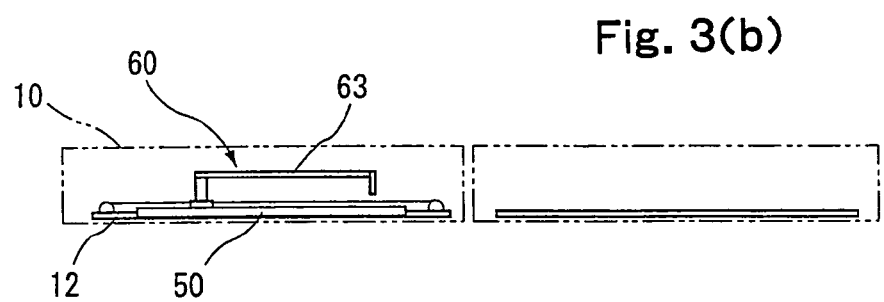

The state shown in FIG. 3(a) and FIG. 3(b) is a state in which the semiconductor manufacturing process in the first vacuum chamber 10 is completed, where the tray 50 mounted with the substrate 40 (see FIG. 1) is at a home position on the guide plate 12 of the first vacuum chamber 10, and the arm portion 63 of the conveying arm 60 is at a risen state and is not engaged with the fit-in hole 52 of the tray 50.

Figure 4A:
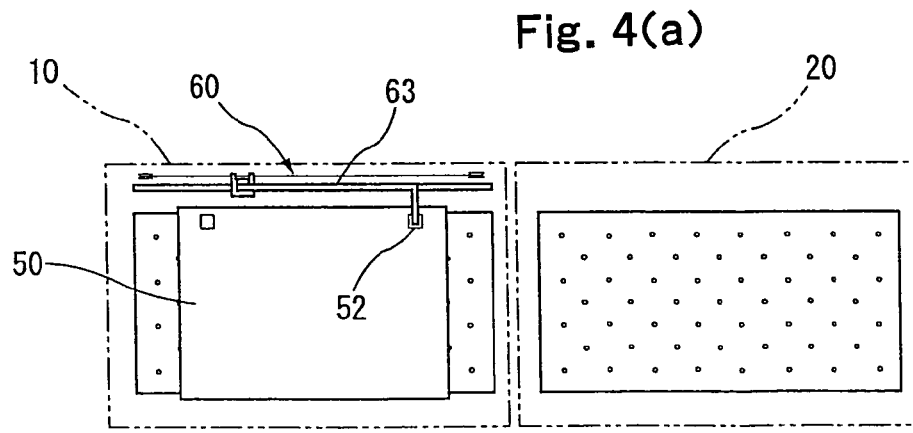
FIG. 4 is an explanatory view explaining the method of moving the plate of the semiconductor manufacturing apparatus shown in FIG. 1.
Figure 4B:
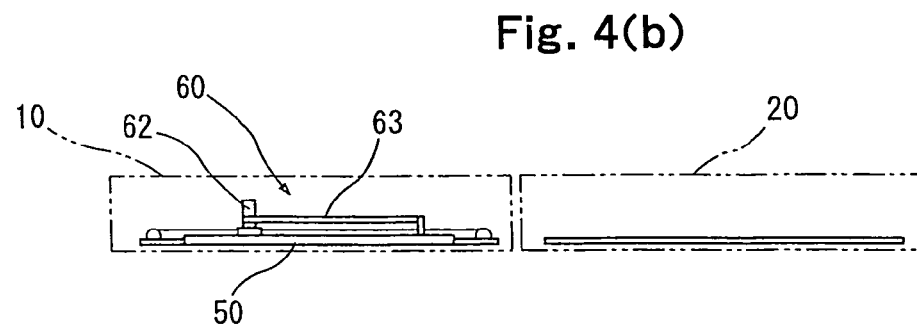

As shown in FIG. 4(a) and FIG. 4(b), the arm portion 63 of the conveying arm 60 is then lowered along the arm guide 62, so that the distal end of the arm portion 63 is inserted into the fit-in hole 52 positioned at the front end of the tray 50 in the moving direction. The shutter 30 (see FIG. 1) isolating the first and second vacuum chambers 10, 20 is then raised to communicate the first and second vacuum chambers 10, 20 with each other.

Figure 5A:
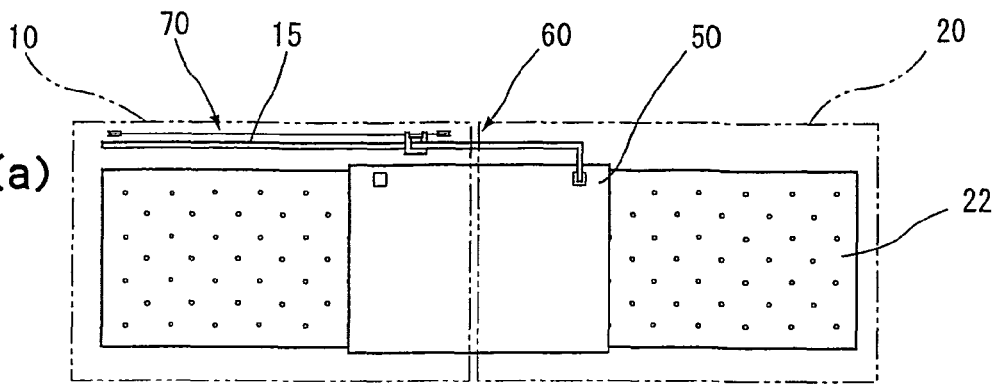
FIG. 5 is an explanatory view explaining the method of moving the plate of the semiconductor manufacturing apparatus shown in FIG. 1.
Figure 5B:
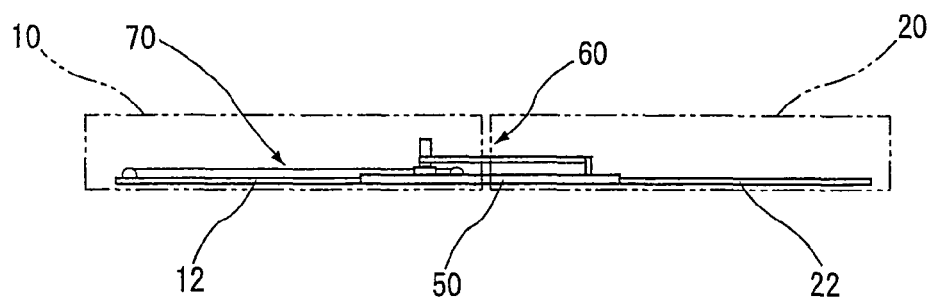

As shown in FIG. 5(a) and FIG. 5(b), gas is emitted from the guide plates 12, 22 of the first and second vacuum chambers 10, 20 to float the tray 50, and the conveying arm 60 is moved from one end to the other end of the rail 15. Since the tray 50 is in the floated state, the conveying arm 60 can smoothly move the tray 50 with minimal force, and thus the load on the conveying arm 60 and the drive section 70 is very small.

Figure 6A:
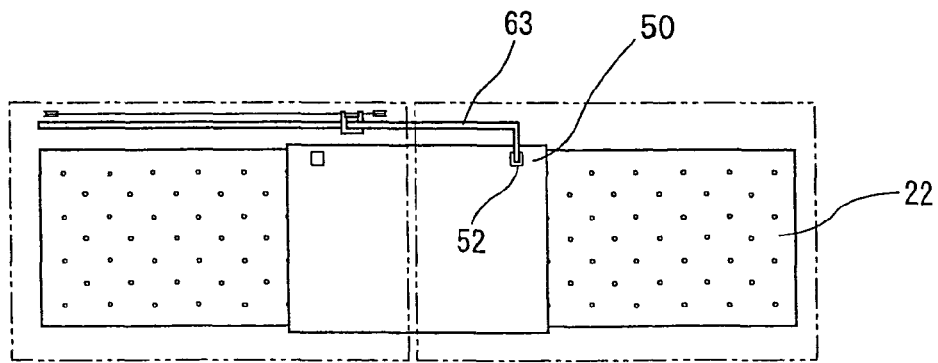
FIG. 6 is an explanatory view explaining the method of moving the plate of the semiconductor manufacturing apparatus shown in FIG. 1.
Figure 6B:
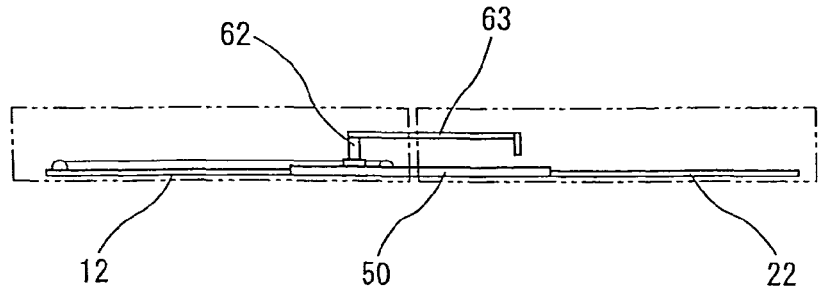

As shown in FIG. 6(a) and FIG. 6(b), the arm portion 63 is raised along the arm guide 62 to release the distal end of the arm portion 63 from the fit-in hole 52 of the tray 50. The emission of gas from the guide plate 12, 22 is stopped simultaneously with or slightly before the rising operation of the arm portion 63, whereby the tray 50 is grounded to the guide plate 12, 22 and waits (positioned) at the relevant position until the next movement.

Figure 7A:
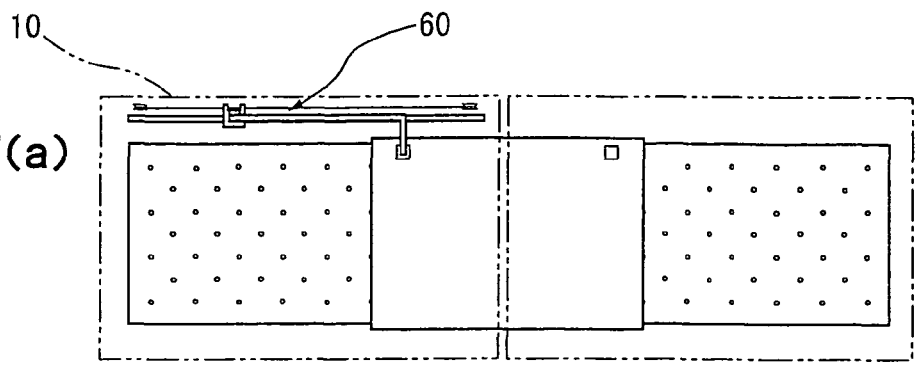
FIG. 7 is an explanatory view explaining the method of moving the plate of the semiconductor manufacturing apparatus shown in FIG. 1.
Figure 7B:
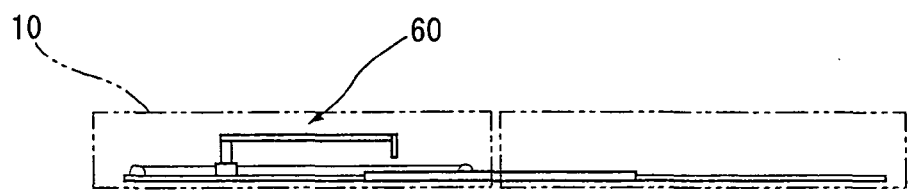

As shown in FIG. 7(a) and FIG. 7(b), the conveying arm 60 is then returned to the home position in the first vacuum chamber 10.

Figure 8A:
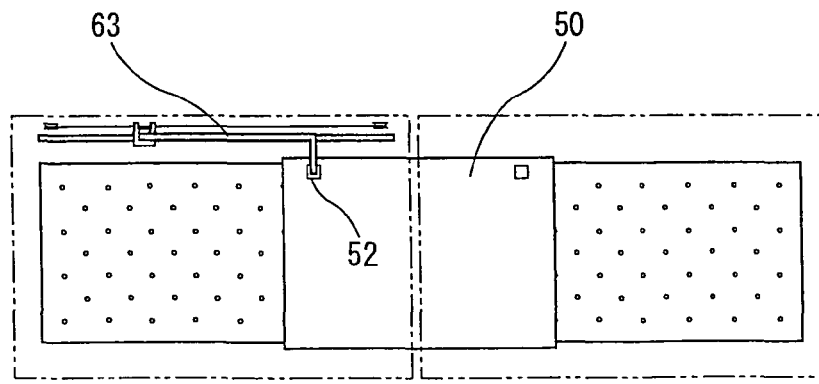
FIG. 8 is an explanatory view explaining the method of moving the plate of the semiconductor manufacturing apparatus shown in FIG. 1.
Figure 8B:
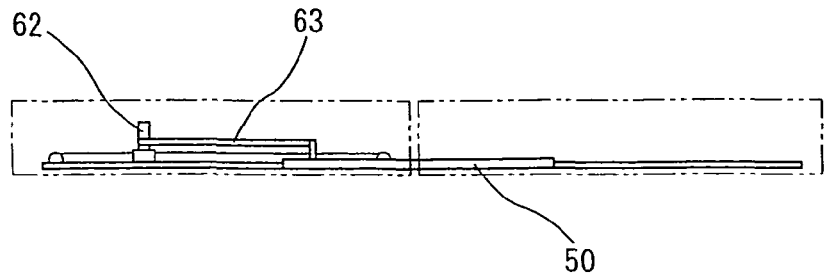

As shown in FIG. 8(a) and FIG. 8(b), the arm portion 63 is lowered along the arm guide 62, so that the distal end of the arm portion 63 is inserted into the fit-in hole 52 positioned at the back end of the tray 50.

Figure 9A:
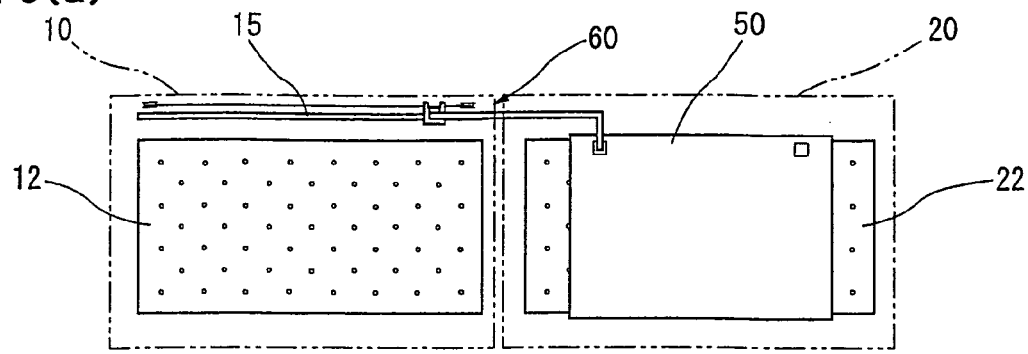
FIG. 9 is an explanatory view explaining the method of moving the plate of the semiconductor manufacturing apparatus shown in FIG. 1.
Figure 9B:
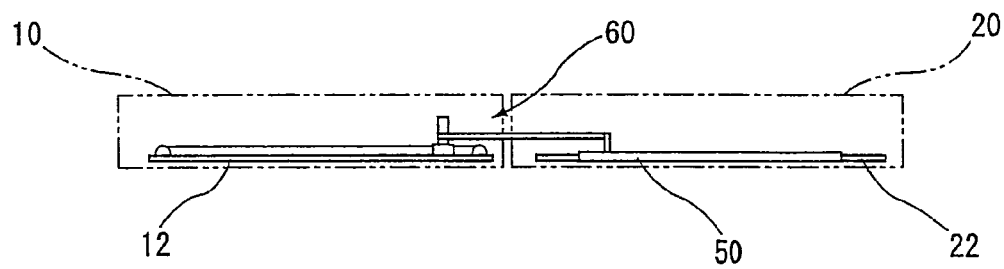

As shown in FIG. 9(a) and FIG. 9(b), the emission of gas from the guide plates 12, 22 of the first and second vacuum chambers 10, 20 that has been interrupted is resumed to float the tray 50, and the conveying arm 60 is moved from one end to the other end of the rail 15. The tray 50 is thereby conveyed to the home position on the guide plate 22 of the second vacuum chamber 20 by the second movement.

Figure 10A:
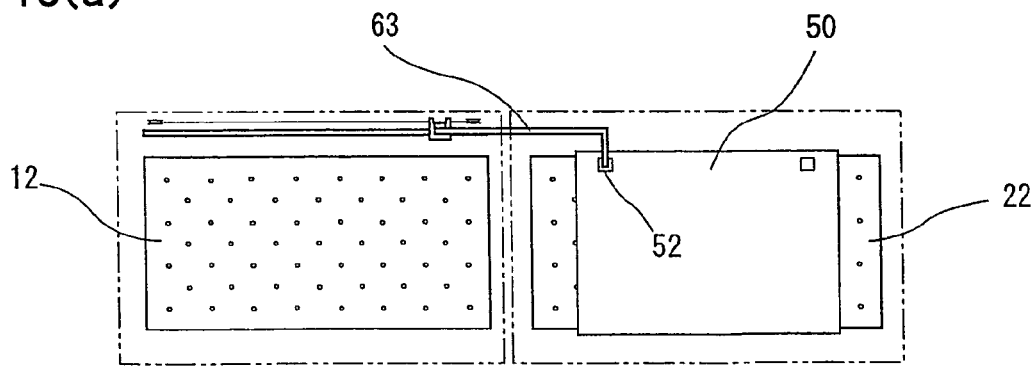
FIG. 10 is an explanatory view explaining the method of moving the plate of the semiconductor manufacturing apparatus shown in FIG. 1.
Figure 10B:
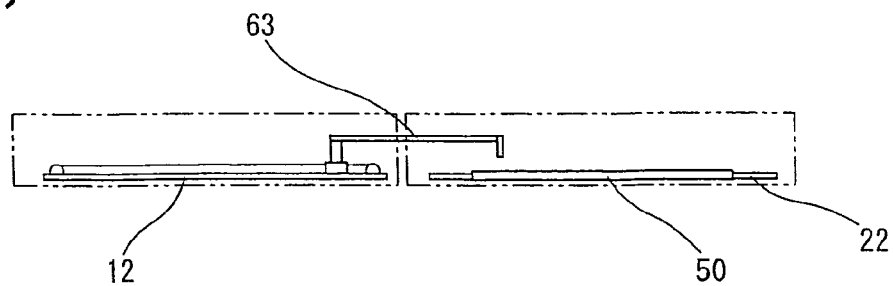

As shown in FIG. 10(a) and FIG. 10(b), after the emission of gas from the guide plates 12, 22 is stopped, and the tray 50 is grounded and positioned on the guide plate 22, the distal end of the arm portion 63 is released from the fit-in hole 52 of the tray 50.

Figure 11A:
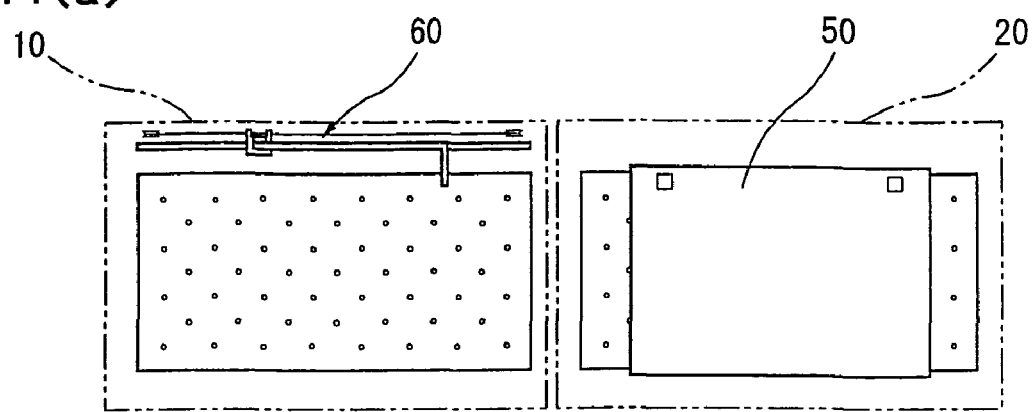
FIG. 11 is an explanatory view explaining the method of moving the plate of the semiconductor manufacturing apparatus shown in FIG. 1.
Figure 11B:
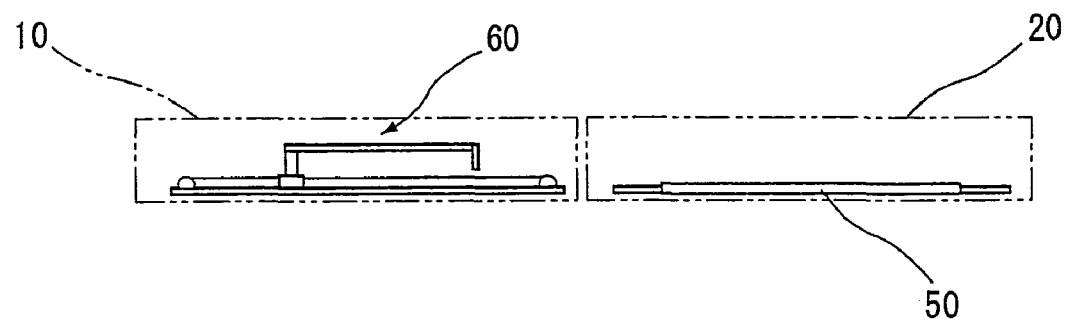

Thereafter, as shown in FIG. 11(a) and FIG. 11(b), the conveying arm 60 is again returned to the home position of the first vacuum chamber 10, and the shutter 30 (see FIG. 1) that has been raised is lowered to again isolate the first and second vacuum chambers 10, 20. The exhaust device 21 (see FIG. 1) connected to the second vacuum chamber 20 is activated to exhaust the second vacuum chamber 20, and the semiconductor manufacturing processes are further performed on the substrate 40 (see FIG. 1) on the tray 50.

One example of the pressure control in the vacuum chamber of when conveying the tray in the above manner will now be mainly explained using FIG. 15.

First, the tray 50 mounted with the substrate 40 is arranged on the guide plate 12 in the first vacuum chamber 10. The first and second vacuum chambers 10, 20 are shielded, and the second vacuum chamber 20 is maintained in a vacuum state at this point.

Next, the first vacuum chamber 10 is sealed to exhaust the internal air by driving the exhaust device 11. Here, air is exhausted up to the exhaust capacity of the exhaust device 11, for example, 5 Pa to sufficiently lower the impurity concentration in the first vacuum chamber 10. The exhaust device 11 is then stopped, and nitrogen gas or the like is injected to the first vacuum chamber 10 up to 2000 Pa by the pressure adjustment gas supply source 4.

To further clean the first vacuum chamber 10, the exhaust device 11 is again activated to exhaust the nitrogen injected into the first vacuum chamber 10. Gas is exhausted up to the exhaust capacity, for example, 5 Pa of the exhaust device 11. Since the impurity concentration in the first vacuum chamber 10 is lowered more effectively by repeating the operation of injecting and exhausting the nitrogen gas, such operation is repeated for five times in the present embodiment. A predetermined process is then performed on the substrate 40 in the cleaned first vacuum chamber 10.

After the processes in the first vacuum chamber 10, the first vacuum chamber 10 is exhausted to 5 Pa. The shutter 30 is then opened to communicate the first and second vacuum chambers 10, 20, and the chamber pressure of the first and second vacuum chambers 10, 20 is raised to substantially the same value in advance by introducing nitrogen gas from one or both pressure adjustment gas supply sources 1, 2 to reduce the vibration of the tray 50 during conveyance. The pressure is set by the sum of the weight of the tray 50 and the weight of the substrate 40 on the tray 50, or is set so as to be 1/800 to 1/5 times of the gas introduction pressure of the inactive gas supply source 80, 80 for emitting the gas from the gas emission holes 13, 23 of each guide plate 12, 22 afterwards.

As described above, the guide plate 12, 22 has a width of 600 mm, a length of 1000 mm, and a thickness of 30 mm, and the gas emission holes 13, 23 has a diameter of 0.5 mm and 5684 holes are arranged at an interval of 10 mm. The tray 50 has a width of 605 mm, a length of 900 mm, and a thickness of 2 mm. Further, the weight of the tray 50 is about 10 kg, and the weight of the substrate 40 is about 8 kg. In this case, the value of about 300 Pa obtained by dividing the total weight of the tray 50 and the substrate 40, which is about 18 kg, by the area of the tray 50, which is about 5400 $cm^2$, is made as the reference, and the chamber pressure of the first and second vacuum chambers 10, 20 is raised to about 1 to 33 times of the reference value, that is, to about 300 to 10000 Pa.

In the present embodiment, a case of opening the shutter 30 first and then supplying nitrogen to the first and second vacuum chambers 1, 2 is illustrated by way of example, but the shutter 30 may be opened after injecting the nitrogen gas.

Nitrogen is then supplied as the inactive gas from the gas supply source 80, 80 and emitted from each gas emission hole 13 of the guide plate 12, 22 thereby floating the tray 50 mounted with the substrate 40, and the arm portion 63 of the conveying arm 60 is moved in the conveying direction to convey the tray 50 along with the substrate 40 from the first vacuum chamber 10 to the second vacuum chamber 20. In this case as well, the pressure of the gas supplied from each gas supply source 80 is set by the sum of the weight of the tray 50 and the weight of the substrate 40 on the tray 50. That is, the value of about 300 Pa obtained by dividing the total weight of the tray 50 and the substrate 40, which is about 18 kg, by the area of the tray 50, which is about 5400 $cm^2$, is made as the reference, and the gas introduction pressure from each gas supply source 80 is controlled to about 160 to 800 times of the reference value, that is, to about 50000 to 240000 Pa.

In this case, the pressure of the first and the second vacuum chambers 10, 20 is raised by injecting nitrogen gas emitted from the emission holes 13. When left in such state, the tray 50 mounted with the substrate 40 contacts the guide plate 12, 22 due to loss of buoyancy, and a satisfactory conveyance cannot be performed. Thus, exhaust adjustment is continuously performed so that the chamber pressure of the first and second vacuum chambers 10, 20 maintains the pressure 300 to 10000 Pa that reduces the vibration of the floating tray using the exhaust device 21 on the second vacuum chamber 20 side, the pressure detecting part 5, the adjustment valve 6 and the like. That is, exhaust is performed at the gas flow rate same as the gas flow rate that flows into the first and second vacuum chambers 10, 20 from the gas supply source 80, 80. Since high precision control becomes difficult as the pressure control of the second vacuum chamber 20 side and the pressure control of the first vacuum chamber 10 side interfere with each other if the exhaust device 11 on the first vacuum chamber 10 side, and the pressure detecting part 5 of the pressure adjustment section, the adjustment valve 6 and the like are also used, pressure is controlled by either stopping the exhaust device 11 on the first vacuum chamber 10 side, closing the adjustment valve 6 or both, and alternatively, separately arranging a conduit, a valve and the like for circulating the exhausted air from the exhaust device 11 to the first vacuum chamber 10. On the contrary, only the pressure control of the first vacuum chamber 10 side may be performed.

When supply of nitrogen gas from the gas supply source 80, 80 is stopped after the tray 50 mounted with the substrate 40 is conveyed to just above the guide plate 22 of the second vacuum chamber 20, the tray 50 is dropped on the guide plate 22 and conveyance is completed.

The arm portion 63 is then moved back to the waiting position, the shutter 30 is closed, and the predetermined processes are performed in the second vacuum chamber 20. Prior to the predetermined process, injection and exhaust of the nitrogen gas may be repeated in the second vacuum chamber 20 for cleaning, similar to above.

Embodiment 2

Figure 12:
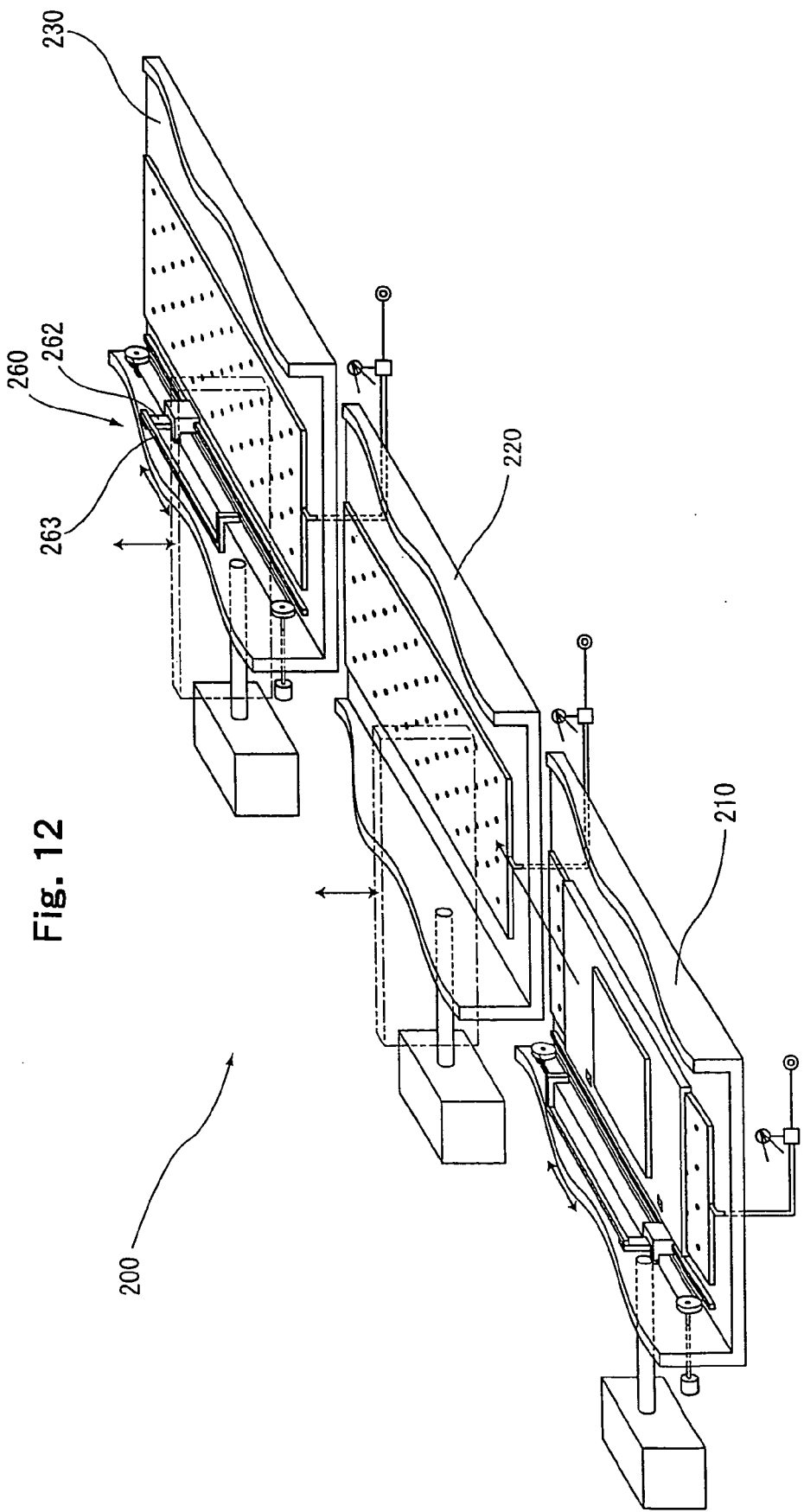
FIG. 12 is a perspective view of a semiconductor manufacturing apparatus according to embodiment 2.

Embodiment 2 will now be explained based on FIG. 12. FIG. 12 is a perspective view of a semiconductor manufacturing apparatus according to embodiment 2.

As shown in FIG. 12, the semiconductor manufacturing apparatus 200 according to embodiment 2 has a third vacuum chamber 230 added to the semiconductor manufacturing apparatus 100 (see FIG. 1) of embodiment 1.

The third vacuum chamber 230 has substantially the same configuration as the first vacuum chamber 210, and only the attaching direction of the arm portion 263 with respect to the arm guide 262 of the conveying arm 260 differs from that of the first vacuum chamber 210. Other configurations are the same as the semiconductor manufacturing apparatus 100 of embodiment 1.

The chamber pressure control of when conveying the tray from the second vacuum chamber 220 to the third vacuum chamber 230 is the same as in embodiment 1.

Embodiment 3

Figure 13:
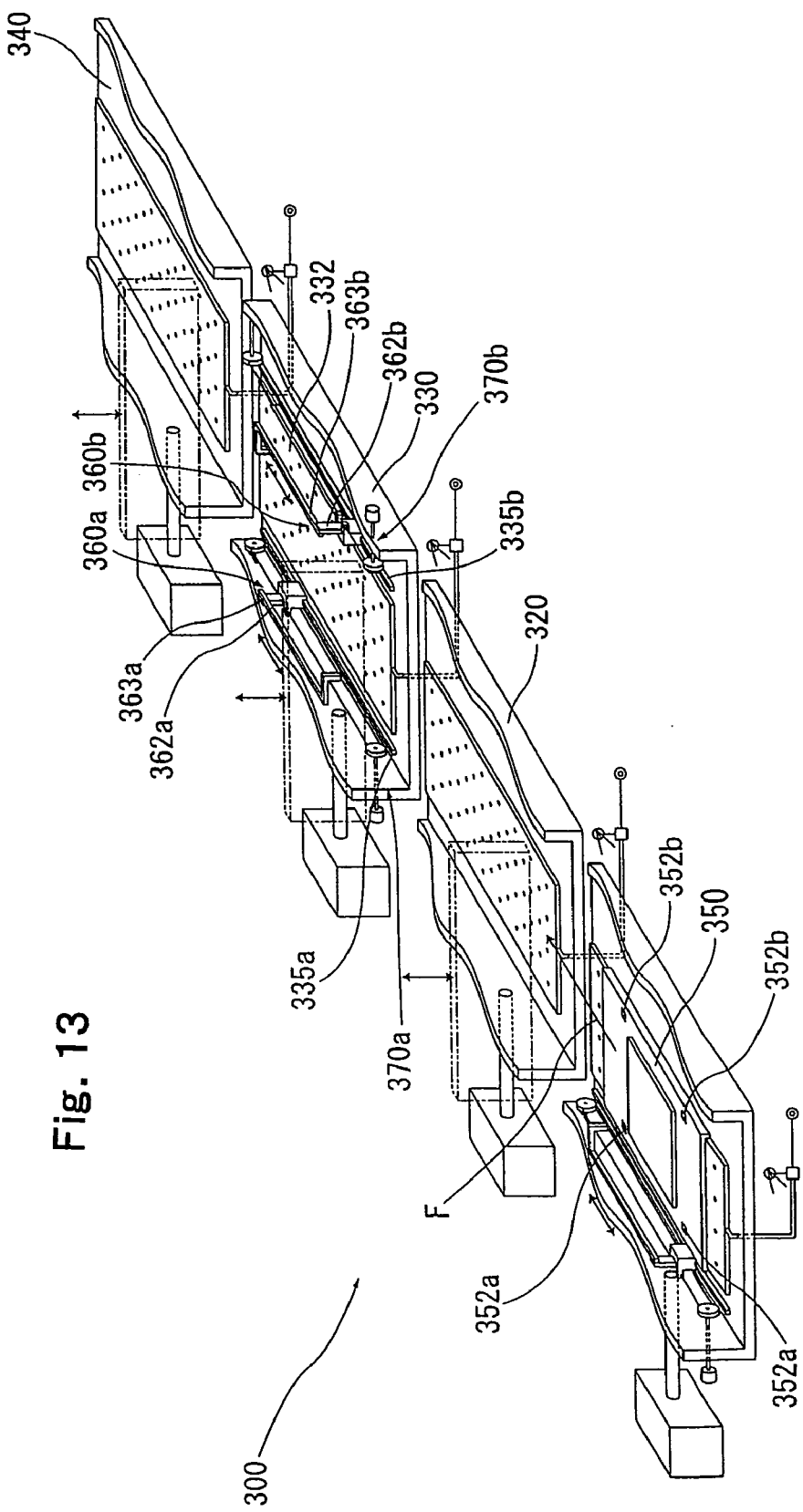
FIG. 13 is a perspective view of a semiconductor manufacturing apparatus according to embodiment 3.

Embodiment 3 will now be explained based on FIG. 13. FIG. 13 is a perspective view of a semiconductor manufacturing apparatus according to embodiment 3.

As shown in FIG. 13, the semiconductor manufacturing apparatus 300 according to embodiment 3 has a third vacuum chamber 330 and a fourth vacuum chamber 340 added to the semiconductor manufacturing apparatus 100 (see FIG. 1) of embodiment 1. Accompanied therewith, the rails 335a, 335b, the conveying arms 360a, 360b and the drive sections 370a, 370b are arranged on both sides of the guide plate 332 in the third vacuum chamber of embodiment 3.

The conveying arm 360a functions to convey the tray 350 between the second vacuum chamber 320 and the third vacuum chamber 330, and the conveying arm 360b functions to convey the tray 350 between the third vacuum chamber 330 and the fourth vacuum chamber 340. Thus, the attaching directions of the arm portions 363a, 363b with respect to the arm guides 362a, 362b are different in the conveying arms 360a, 360b.

The tray 350 is formed with the fit-in holes 352a, 352b corresponding to the conveying arms 360a, 360b at two opposing edges parallel to the conveying direction F.

Other configurations are the same as the semiconductor manufacturing apparatus 100 of embodiment 1. The chamber pressure controls in conveying the tray from the second vacuum chamber 320 to the third vacuum chamber 330 and in conveying the tray from the third vacuum chamber 330 to the fourth vacuum chamber 340 are the same as in embodiment 1. The tray can be moved between five, six or more vacuum chambers by repeating the configuration similar to embodiment 3.

Embodiment 4

Figure 14:
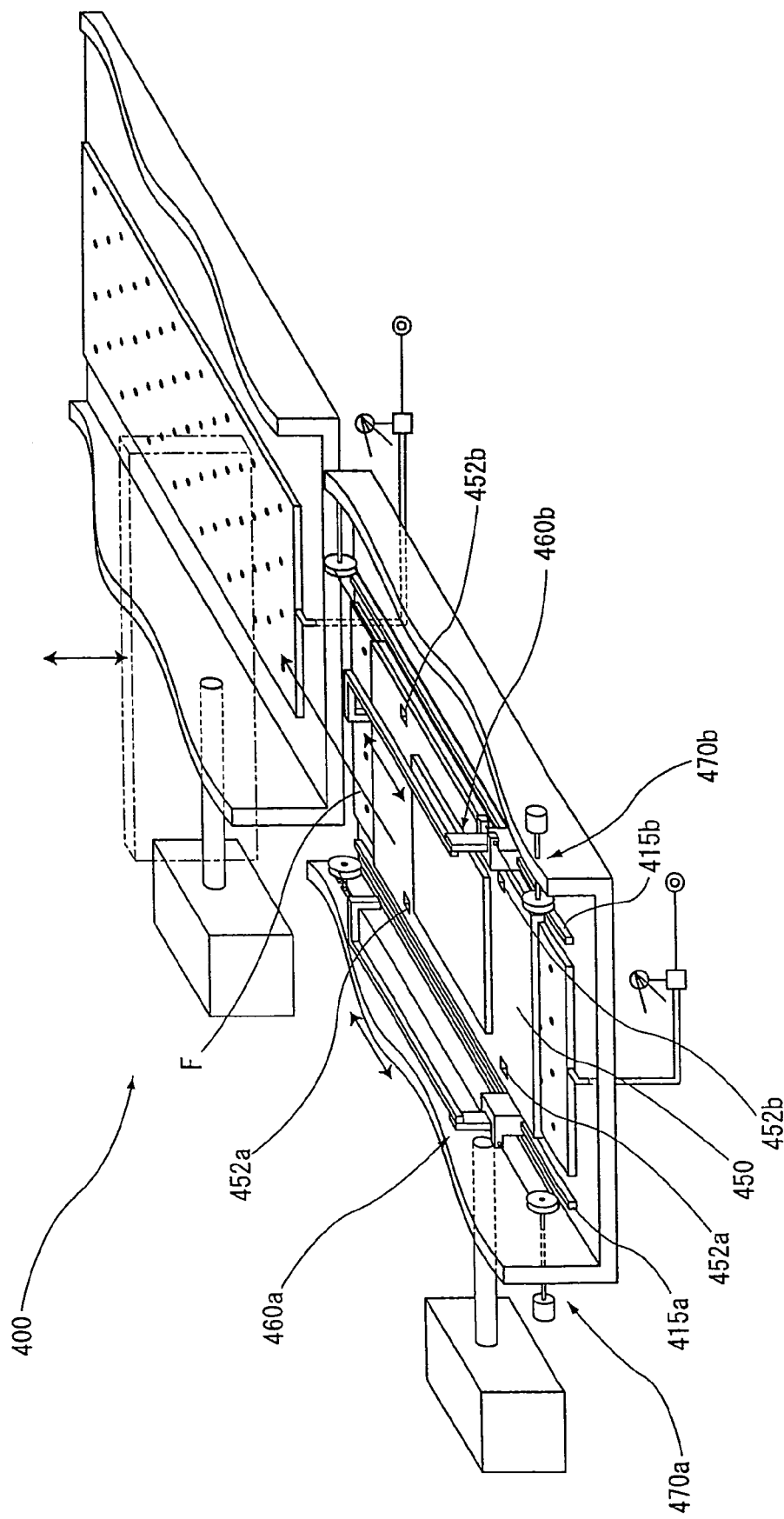
FIG. 14 is a perspective view of a semiconductor manufacturing apparatus according to embodiment 4.

Embodiment 4 will now be described based on FIG. 14. FIG. 14 is a perspective view of a semiconductor manufacturing apparatus according to embodiment 4.

As shown in FIG. 14, the semiconductor manufacturing apparatus 400 of embodiment 4 has rails 415a, 415b, conveying arms 460a, 460b, and drive sections 470a, 470b arranged on both sides of the guide plate 412.

Accompanied therewith, the tray 450 is formed with the fit-in holes 452a, 452b corresponding to the conveying arms 460a, 460b at two opposing edges parallel to the conveying direction F. Other configurations are the same as the semiconductor manufacturing apparatus 100 (see FIG. 1) of embodiment 1.

That is, the tray 50 is moved only by the driving force received from one side of the guide plate 12 in embodiment 1, whereas the driving force is applied from both sides of the guide plate 412 in embodiment 4. Thus, a more stable conveyance becomes possible than the semiconductor manufacturing apparatus 100 of embodiment 1.

Other Embodiments

In the above embodiments, a case of supplying the pressure adjustment gas for adjusting the chamber pressure of the first and second vacuum chambers 10, 20 from the pressure adjustment gas supply source 4, 4 when conveying the tray is illustrated by way of example, but the pressure adjustment gas supply source 4, 4 may be omitted, and the pressure adjustment gas may be supplied from the gas supply source 80, 80. In this case, in addition to the conduit for communicating with the guide plates 12, 22, a conduit for communicating the gas supply source 80, 80 and the first and second vacuum chambers 10, 20 and an adjustment valve such as a throttle valve in the middle of each conduit are arranged.

INDUSTRIAL APPLICABILITY

The present technology is generally applicable to the manufacturing apparatus and the manufacturing method for performing predetermined processes (various processes performed in the field of semiconductor manufacturing such as film growing process, plasma process, annealing process, etching process etc.) on various substrates such as a semiconductor substrate, glass substrate and the like, and for example, is applicable to the semiconductor manufacturing apparatus and the semiconductor manufacturing method for manufacturing a semiconductor device such as a transistor, memory, IC, LSI etc., organic or inorganic solar battery, display such as liquid crystal, plasma, electroluminescence etc.

The invention claimed is:

1. A semiconductor manufacturing apparatus comprising:
   a plurality of vacuum chambers corresponding to a plurality of processing sections necessary for manufacturing a semiconductor device;
   an exhaust device connected to each vacuum chamber;
   a plate shaped guide plate arranged at the bottom of each vacuum chamber and having a plurality of gas emission holes;
   a gas supply source for supplying gas to the gas emission holes;
   a shutter located between each adjacent pair of vacuum chambers;
   a tray mounted on the guide plate of one of the vacuum chambers for receiving a substrate which is to be processed in the vacuum chambers, wherein the tray includes a plurality of engagement parts arranged along a moving direction of the tray, and wherein each engagement part is one of a recess and a projection;
   a conveying function section having a conveying arm that contacts the engagement parts of the tray, individually and detachably, to move the tray from a first vacuum chamber to a second adjacent vacuum chamber along the guide plates in the first and second vacuum chambers, wherein the conveying arm engages a first engagement part of the tray to cause the tray to move partway to a target position, and wherein the conveying arm releases the first engagement part and engages a second engagement part of the tray to move the tray to the target position; and
   a controlling function section, the controlling function section performing the control so as to open the shutter between the first and second vacuum chambers, emit gas from the gas emission holes of the guide plates in the first and second vacuum chambers, and move the tray in one vacuum chamber, which is floated by the emitted gas, from the guide plate of one vacuum chamber to the guide plate of the other vacuum chamber along the guide plates by means of the conveying arm.

2. The manufacturing apparatus according to claim 1, wherein the controlling function section has an operation controlling section for performing operation control of the conveying arm and the shutter, and a pressure controlling function section for performing pressure control of each vacuum chamber, the pressure controlling function section includes a configuration of including a pressure adjusting gas supply source for supplying pressure adjusting gas to each vacuum chamber, a pressure detecting part for detecting the pressure in each vacuum chamber, an adjustment valve for adjusting the exhausting amount from each vacuum chamber, and a pressure controlling section for controlling the adjustment valve so as to adjust the pressure of each vacuum chamber when input with a signal from the pressure detecting part.

3. The manufacturing apparatus according to claim 1, wherein the tray includes a locking part for holding the tray on the guide plates when the tray is being moved by the conveying arm.

4. The manufacturing apparatus according to claim 1, wherein the conveying function section further includes a drive section for moving the conveying arm, the drive section comprising a pair of pulleys and a wire wound around the pair of pulleys.

5. The manufacturing apparatus according to claim 4, wherein the drive section include a tensile force adjustment mechanism for maintaining the tensile force of the wire constant.

6. The manufacturing apparatus according to claim 4, wherein the conveying arm is fastened at one point on the wire, the moving distance of the conveying arm and the moving distance of the one point on the wire are the same when the wire is moved by the pair of pulleys.

7. The manufacturing apparatus according to claim 1, wherein the tray is grounded on at least one of the guide plates when the emission of gas from the gas emission holes stops.

8. The manufacturing apparatus according to claim 1, wherein the emission of gas from the gas emission holes is interrupted from the time the conveying arm releases the engagement with the first engagement part until the conveying arm engages the second engagement part, and the tray is grounded and positioned on at least one of the guide plates while the emission of the gas is interrupted.

9. The manufacturing apparatus according to claim 1, wherein the first engagement part is positioned at a first end of the tray in the moving direction of the tray.

10. The manufacturing apparatus according to claim 1, wherein a mechanism for moving the conveying arm is provided within only one of the first and second adjacent vacuum chambers and the conveying arm is configured so as to move the tray within one vacuum chamber to the other adjacent vacuum chamber.

11. The manufacturing apparatus according to claim 1, wherein the conveying arm is configured to move the tray from a position entirely within one vacuum chamber to a position entirely within the adjacent vacuum chamber.

12. The manufacturing apparatus according to claim 1, wherein the conveying arm includes a tray contact portion to be in contact with the tray, and the conveying arm is configured so as to move the tray so that the tray contact portion pushes the rear end of the tray in the moving direction of the tray.

13. The manufacturing apparatus according to claim 1, wherein the conveying arm includes a tray contact portion to be in contact with the tray, and the conveying arm is configured so that the tray contact portion is able to move from one vacuum chamber into the other adjacent vacuum chamber.

14. A semiconductor manufacturing apparatus comprising:
a plurality of vacuum chambers corresponding to a plurality of processing sections necessary for manufacturing a semiconductor device;
an exhaust device connected to each vacuum chamber;
a plate shaped guide plate arranged at the bottom of each vacuum chamber and having a plurality of gas emission holes;
a gas supply source for supplying gas to the gas emission holes;
a shutter located between each adjacent pair of vacuum chambers;
a tray mounted on the guide plate of one of the vacuum chambers for receiving a substrate which is to be processed in the vacuum chambers;
a conveying function section having a conveying arm that contacts the tray to move the tray from a first vacuum chamber to a second adjacent vacuum chamber along the guide plates in the first and second vacuum chambers, wherein a range of movement of the conveying arm is smaller than a distance that the tray must travel to move from the first vacuum chamber to the second adjacent vacuum chamber, wherein the conveying arm engages a first portion of the tray to cause the tray to move partway from the first vacuum chamber into the second adjacent vacuum chamber, and wherein the conveying arm releases the first portion of the tray and engages a second portion of the tray to move the tray fully into the second adjacent vacuum chamber; and
a controlling function section, the controlling function section performing the control so as to open the shutter between the first and second vacuum chambers, emit gas from the gas emission holes of the guide plates in the first and second vacuum chambers, and cause the conveying mechanism to move the tray from the first vacuum chamber into the second adjacent vacuum chamber by means of the conveying arm.

15. The manufacturing apparatus according to claim 14, wherein a mechanism for moving the conveying arm is provided within only one of the first and second adjacent vacuum chambers.

* * * * *